US011353529B2

United States Patent
Zeller

(10) Patent No.: US 11,353,529 B2
(45) Date of Patent: Jun. 7, 2022

(54) METHOD FOR GENERATING A MAGNETIC RESONANCE IMAGE, COMPUTER PROGRAM, DATA MEMORY, AND MAGNETIC RESONANCE SYSTEM

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 357 days.

(21) Appl. No.: 16/554,905

(22) Filed: Aug. 29, 2019

(65) Prior Publication Data
US 2020/0072927 A1  Mar. 5, 2020

(30) Foreign Application Priority Data
Aug. 29, 2018 (DE) .......................... 102018214636.5

(51) Int. Cl.
*G06K 9/00* (2022.01)
*G01R 33/48* (2006.01)
*G06T 11/00* (2006.01)
*G01R 33/56* (2006.01)

(52) U.S. Cl.
CPC ....... *G01R 33/482* (2013.01); *G01R 33/5608* (2013.01); *G06T 11/008* (2013.01)

(58) Field of Classification Search
CPC .............. G01R 33/482; G01R 33/5608; G01R 33/565; G01R 33/561; G01R 33/56341; G01R 33/5611; G01R 33/56509; G01R 3/5608; G06T 11/008; G06T 11/005; A61B 5/055

USPC .......................................................... 382/131
See application file for complete search history.

(56) References Cited

U.S. PATENT DOCUMENTS

| 7,397,242 | B2* | 7/2008 | Samsonov | G01R 33/5611 324/307 |
| 7,634,119 | B2* | 12/2009 | Tsougarakis | B23P 19/00 382/128 |
| 2006/0183996 | A1* | 8/2006 | Abe | G01R 33/5676 600/410 |
| 2006/0273792 | A1* | 12/2006 | Kholmovski | G01R 33/5611 324/309 |

(Continued)

OTHER PUBLICATIONS

Frost, Robert et al. "Implementation and Assessment of Diffusion-Weighted Partial Fourier Readout-Segmented Echo-Planar Imaging" Magnetic Resonance in Medicine, vol. 68, pp. 441-451, 2012 // DOI 10.1002/mrm.23242.

(Continued)

*Primary Examiner* — Mahendra R Patel
(74) *Attorney, Agent, or Firm* — Banner & Witcoff Ltd.

(57) ABSTRACT

The disclosure relates to a method for generating a magnetic resonance image from a measurement dataset. The measurement dataset is initially acquired from k space values. By means of a data processing facility the k space values are then automatically analyzed at least in terms of their size. Furthermore a modified measurement dataset is automatically generated from the measurement dataset by removing k space values whose size satisfies at least one predetermined threshold value criterion. The magnetic resonance image is then generated automatically from the modified measurement dataset.

20 Claims, 4 Drawing Sheets

(56) References Cited

U.S. PATENT DOCUMENTS

| | | | | |
|---|---|---|---|---|
| 2007/0238976 | A1* | 10/2007 | Ishihara | G01R 33/4804 600/411 |
| 2011/0144524 | A1* | 6/2011 | Fish | A61B 34/10 600/547 |
| 2012/0206140 | A1* | 8/2012 | Banerjee | G01R 33/5611 324/309 |
| 2013/0113482 | A1* | 5/2013 | Speier | G01R 33/4818 324/309 |
| 2013/0236075 | A1* | 9/2013 | Smith | G01R 33/5659 382/131 |
| 2016/0003928 | A1* | 1/2016 | Chen | G01R 33/4822 324/309 |
| 2016/0202337 | A1* | 7/2016 | Muhlsteff | G01R 33/5673 324/309 |
| 2016/0349344 | A1* | 12/2016 | Nielsen | G01R 33/4835 |
| 2017/0007148 | A1* | 1/2017 | Kaditz | A61B 5/055 |
| 2018/0189930 | A1* | 7/2018 | Dannels | G01R 33/56545 |
| 2018/0247436 | A1* | 8/2018 | Korobchenko | G01R 33/5608 |
| 2019/0012813 | A1* | 1/2019 | Bauer | G01R 33/5676 |
| 2020/0225308 | A1* | 7/2020 | Dosenbach | A61B 5/7207 |

OTHER PUBLICATIONS

German Office Action dated Jul. 15, 2019, for Application No. 10 2018 214 636.5.

* cited by examiner

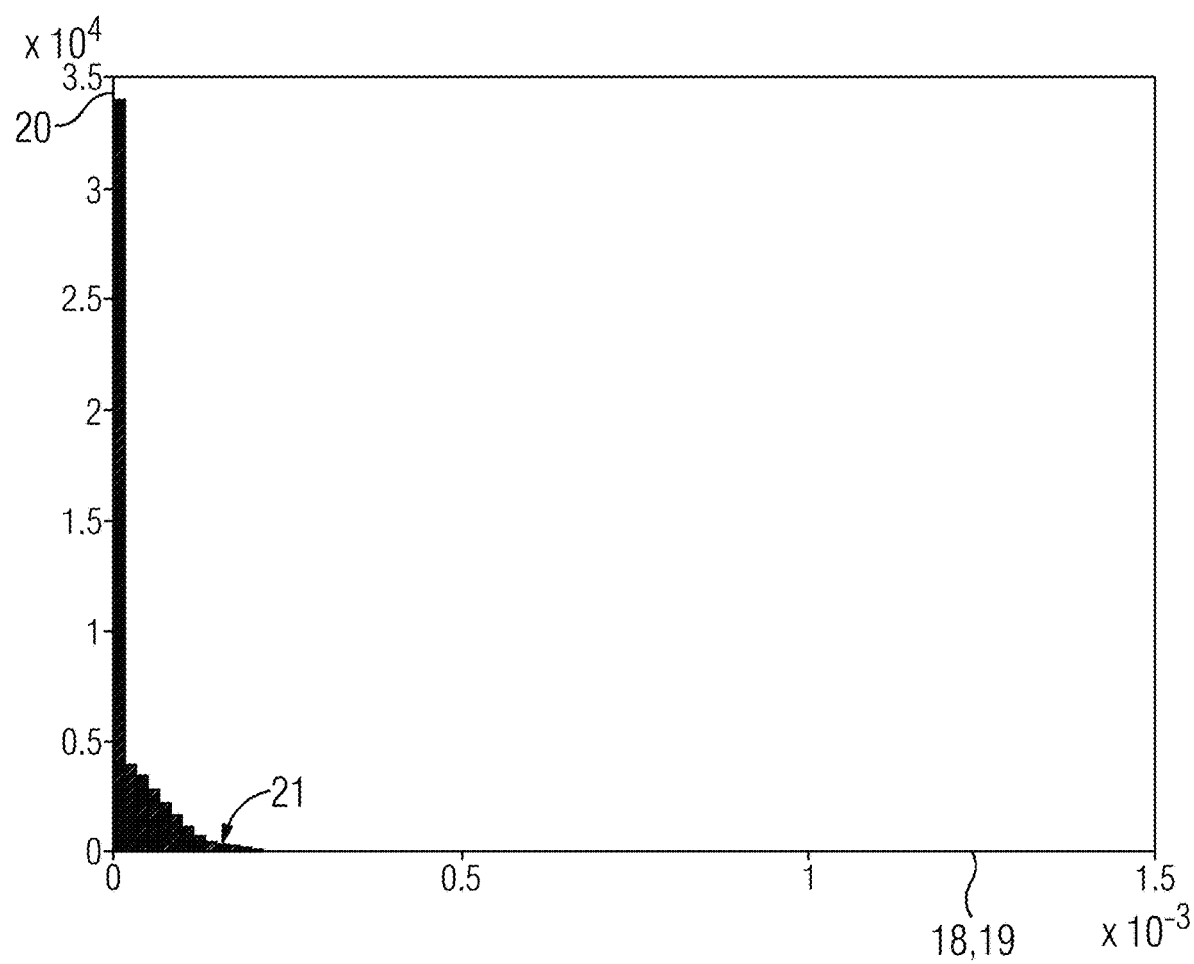

(State of the Art)

(State of the Art)

METHOD FOR GENERATING A MAGNETIC RESONANCE IMAGE, COMPUTER PROGRAM, DATA MEMORY, AND MAGNETIC RESONANCE SYSTEM

CROSS-REFERENCE TO RELATED APPLICATIONS

The present application claims the benefit of the filing date of German patent application no. DE 10 2018 214 636.5, filed on Aug. 29, 2018, the contents of which are incorporated herein by reference in their entirety.

TECHNICAL FIELD

The disclosure relates to a method for generating a magnetic resonance image, a corresponding computer program, a data memory with such a computer program, and a correspondingly set-up magnetic resonance system.

BACKGROUND

Imaging by means of magnetic resonance technology, that is to say such as by means of a magnetic resonance tomography unit (MRT), is a widespread methodology in medical, but also in other industrial, applications at the present time. Depending on the methods applied in this regard, the result can be unwanted image artifacts that do not represent any real features or properties of a respectively mapped investigation or target object.

SUMMARY

There exists a multiplicity of approaches to improving the image quality of resulting magnetic resonance images, that is to say reconstructed on the basis of MR data or raw data recorded by means of a magnetic resonance tomography unit, and increasing the efficiency of acquiring the MR data.

The object of the present disclosure is to enable the generation of magnetic resonance images with improved image quality. This is achieved by the subject matters of the independent claims and the other embodiments as discussed herein. Advantageous developments and embodiments of the present disclosure are further disclosed in the dependent claims, in the description, and in the drawings.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Further features, details, and advantages of the present disclosure arise from the following description of preferred exemplary embodiments and also on the basis of the drawings, in which:

FIG. 6 shows an example histogram generated from a measurement dataset of k space values, in accordance with an embodiment of the present disclosure.

The exemplary embodiments of the present disclosure will be described with reference to the accompanying drawings. The drawing in which an element first appears is typically indicated by the leftmost digit(s) in the corresponding reference number.

DETAILED DESCRIPTION

Figure 1:
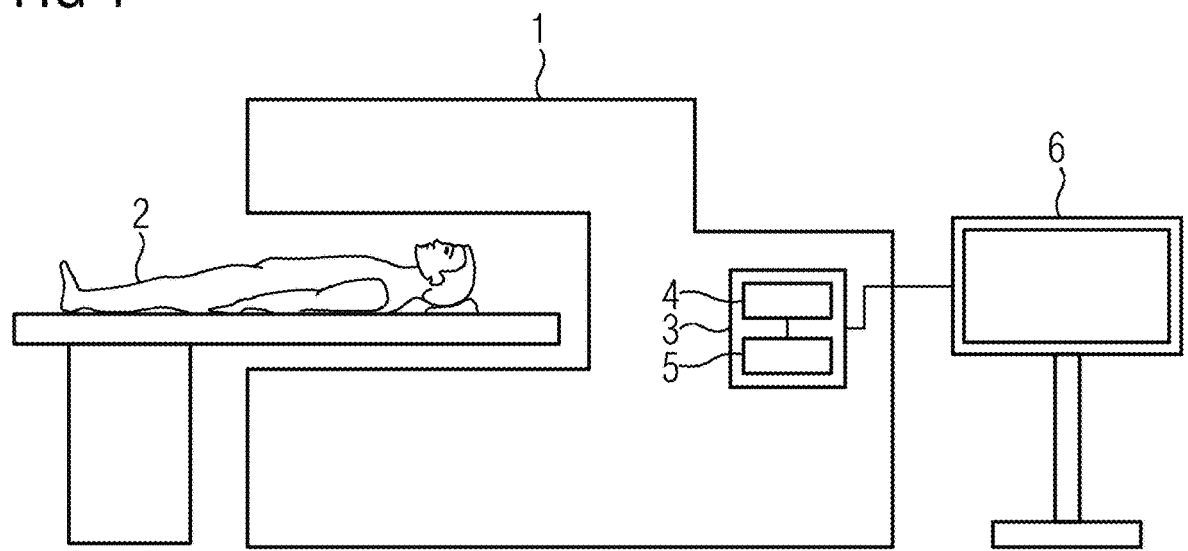
FIG. 1 shows a schematic view of an example magnetic resonance system, in accordance with an embodiment of the present disclosure.

In an embodiment, a method is used for generating a magnetic resonance image from a measurement dataset. In this regard, the measurement dataset is initially acquired from k space values. By means of a data processing facility, the k space values of the measurement dataset are then automatically analyzed at least in terms of their size, that is to say their values or amounts. Then, by means of the data processing facility, a modified measurement dataset is automatically generated from the measurement data set. To do this, k space values having a size that satisfies at least one predetermined threshold value criterion are removed from the measurement dataset. As explained below, further criteria or conditions can be applied in this regard so that, for example, only part of the k space values that satisfy the predetermined threshold value criterion, or respectively whose size satisfies the predetermined threshold value criterion, are removed from the measurement dataset. By means of the data processing facility, the magnetic resonance image is then generated automatically from the modified measurement dataset, that is to say reconstructed or calculated, for example by means of a Fourier transform.

The magnetic resonance image, for the purpose of the present disclosure, is an image of a target object, for example a patient or a tissue or organ. To generate the magnetic resonance image from the modified measurement, dataset methods can be used that are familiar from magnetic resonance imaging. The measurement dataset is a collection of data that comprises at least a multiplicity of k space values. The measurement dataset, that is to say the k space values, can be recorded in the form of measured data or raw data by means of a magnetic resonance system, that is to say for example by means of a magnetic resonance tomography unit. In line with known k space formalism, the measurement dataset can be a matrix for example in which the k space values are stored. The individual k space values can be understood as local frequencies or local frequency components.

For the purpose of the present disclosure, acquisition of the measurement dataset or the k space values, respectively, can mean or comprise actual measuring or recording of k space values. In the same way, however, acquisition of the measurement dataset or the k space values respectively can mean or comprise receiving or retrieving the measurement dataset or the k space values, respectively, in the form of electronic data via a corresponding interface of the data processing facility, and/or for example from a corresponding data memory. That is to say the measurement dataset or the k space values, respectively, can then be acquired in particular by the or from the data processing facility.

In this regard, the data processing facility can form part of the magnetic resonance system or be connected to the same via a corresponding direct or indirect data link. It is possible, for example, for the data processing facility to be arranged at the same site of an enterprise or facility, for example a hospital or similar, where the magnetic resonance system is also located. In this regard, however, the magnetic resonance system can be located for example in an investigation room, while the data processing facility can be located at some spatial distance from same, for example in a computer center (on premise). In the same way, the data processing facility can be a server facility for example, such as a cloud server, or part of a separate, that is to say located at a different site, computer center. In the same way, it is possible, for example, for the magnetic resonance system and the data processing facility to be able to access the same data memory on which the measurement dataset is then stored or temporarily stored.

Analysis of the k space values in terms of their size means that the k space values are processed with the sizes of the k space values being taken into account. For example, this can mean or comprise the k space values being sorted according to their size, relative size relationships between a few or all the k space values being determined, or other matters of this kind. To do this, a corresponding algorithm or a corresponding program can be applied to the k space values or the measurement dataset, respectively, that is to say the k space values or the measurement dataset, respectively, are made available as input data to the algorithm or the program.

The removal of k space values from the measurement dataset to generate the modified or adapted measurement dataset can, for example, mean or comprise the corresponding k space values being deleted from the measurement dataset or being replaced by other, in particular predetermined, values.

The predetermined threshold value criterion is described in further detail below. Mention is made at this point by way of example, that those of the k space values which, or whose sizes respectively, are greater than a predetermined threshold value, can satisfy the predetermined threshold value criterion. In other words peaks, that is to say local maxima or extreme values, can then preferably be removed from the measurement dataset.

Advantageously, an improved image quality of the magnetic resonance image can be achieved by the present disclosure. In particular, the present disclosure prevents or reduces the creation of mesh-like or net-like patterns or artifacts in the magnetic resonance image. While other approaches provide for post-processing on the respective generated or reconstructed magnetic resonance images, in contrast the present disclosure additionally offers the advantage of enabling or achieving improved image quality simply and efficiently, since the measurement dataset is already edited or processed prior to generation or reconstruction of the magnetic resonance image. Such k space values of the measurement dataset which would or could result in the said artifacts are therefore, in the case of the present disclosure, not even processed for generating or reconstructing the magnetic resonance image. As a result, advantageously, the data processing or computing effort needed overall can be minimized. Determining which of the k space values satisfy at least the predetermined threshold value criterion, and removing these k space values from the measurement dataset, requires such minimal computing effort in this regard that it can advantageously be carried out without significant time delay, including by means of non-specialized hardware, e.g. by means of a local arithmetic-logic unit of the respective magnetic resonance system by means of which the measurement dataset is originally acquired. If the resulting modified measurement dataset is then transmitted, for example for generation of the magnetic resonance image, to a data processing facility arranged at a distance, for example a computer center or a cloud server, this can advantageously be effected with a reduced data volume.

The data processing facility can have at least one processor, microchip, and/or microcontroller, and also a data memory connected to same. The data processing facility can therefore be set up to execute the described method steps, measures, and calculations automatically, by using these means.

In an embodiment of the present disclosure, a method can be applied particularly advantageously in conjunction with diffusion or diffusion tensor imaging. This applies for example if a Partial Fourier (PF) technique is additionally applied. In PF techniques, the whole of the k space is not usually sampled, that is to say acquired or measured. Instead, different reconstruction methods are applied to fill in the non-measured part of the k space. In a method referred to as "zero-filling," non-sampled regions of the k space are filled in by zeroes or zero values. This is a very simple method, but generally results in additional or increased fuzziness in the resulting magnetic resonance image compared to imaging techniques which acquire the entire k space.

An alternative method uses the so-called POCS (Projection Onto Convex Sets) algorithm that estimates missing, that is to say non-measured, parts of the k space in an iterative process, and in this regard ensures data consistency with actually measured parts of the k space, that is to say actually measured k space values. Reference is made in this regard for example to the publication [1]. This methodology can result in improved sharpness or local resolution but cannot always be applied reliably, for example depending on certain phase variations in the underlying measurement dataset. As a result, the said mesh-like or net-like artifacts or image defects can be reinforced, which can then hide lesions in the mapped target object or make them harder to identify, for example.

The application of the present disclosure is not limited to these examples, however. In fact, the present disclosure is based on the finding that the said artifacts can be caused in particular by local peaks or maximum values in the measurement dataset. Peaks or maximum values of this kind can be caused, for example, by unwanted radio-frequency (RF) or high-frequency (HF) peaks or, respectively, corresponding discharges in the electric and/or magnetic facilities of the respective magnetic resonance system during measurement, that is to say during acquisition or recording of the measurement dataset. For example, if a HF discharge takes place in a gradient coil of the magnetic resonance system while the measurement dataset, that is to say the k space values, are being measured, this can result in an intensity peak or maximum value in the measurement dataset which does not describe or represent any actual property of the respectively mapped target object. Where the POCS algorithm is applied, such intensity peaks can be mirrored, that is to say duplicated, and therefore the problem of the mesh-like or net-like artifacts reinforced.

An advantage of the present disclosure is that the POCS algorithm can continue to be applied, and thus the improved spatial resolution that can be achieved by same retained, but at the same time the said artifacts can be prevented or at least attenuated.

In an advantageous embodiment of the present disclosure, during analysis the k space covered by the measurement dataset is searched or explored for local peaks, that is to say local maxima or extreme values, which satisfy at least the predetermined threshold value criterion. In this regard, the k space covered by the measurement dataset can comprise the actually measured k space values contained in the measurement dataset, but also the subsequently filled-in or reconstructed k space values. During removal, k space values in a respective predetermined vicinity of the local peaks found are then additionally removed from the measurement dataset. In other words, for each peak found, not only the respective maximum value, but also a sub region of the measurement dataset comprising that peak or maximum value, is therefore removed from the measurement dataset. As a result, it is possible to take into account that, for example, the described discharges can affect not only one but multiple adjacent k space values in each case. Using this approach advantageously means that the ultimate resulting image quality of the magnetic resonance image generated from the correspondingly modified measurement dataset can be further improved.

The predetermined vicinity can define a certain distance in the k space for example, it being possible for all k space values exhibiting at most this predetermined distance from the respective peak or maximum value to be removed. In the same way, for example, the predetermined vicinity can specify or define a certain quantity of k space values and/or a certain pattern. For example, if a quantity n of k space values is predefined then, for example, the n k space values lying closest to the respective peak or maximum value can be removed from the measurement dataset. Removal can be carried out according to the predetermined pattern or a predetermined grid for example, with all k space values in the predetermined vicinity around the respective peak or maximum value that are acquired by the respective pattern or grid then being removed. For example, k space values in a disk-shaped or rectangular region around the respective peak or maximum value can be removed. This enables a further optimization of the method as described herein or, respectively, the resulting image quality of the magnetic resonance image to be achieved.

In a further advantageous embodiment of the present disclosure, the k space values are replaced by zero to remove them. In other words, zeroes or zero values are therefore written in the measurement dataset at positions of k space values satisfying at least the predetermined threshold value criterion, that is to say at positions of corresponding local peaks in the measurement dataset. This represents a particularly simple and consistent option for removing the corresponding k space values. Advantageously, therefore, the corresponding k space values satisfying at least the predetermined threshold value criterion make no contribution to the resulting magnetic resonance image, without there being any need for additional data or information about the corresponding positions in the measurement dataset.

In a further advantageous embodiment of the present disclosure, the k space values are additionally analyzed in terms of their location in the k space covered by the measurement dataset or in the measurement dataset, respectively. Only those k space values are then removed from the measurement dataset having a size that satisfies at least the predetermined threshold value criterion and which lie (i.e., are located) in a predetermined sub region of the k space at an edge, that is to say in an edge region, of the k space. In other words, a predetermined local criterion is therefore taken into account or evaluated in addition to the predetermined threshold value criterion. For example an outer quarter, that is to say the outer (i.e. lying at the farthest distance from the center of the k space, for example, 25% of the k space) can be specified as the predetermined sub region of the k space. For example, it is therefore possible for only those k space values to be removed that satisfy at least the predetermined threshold value criterion and the local criterion, for which it is therefore true that removal of their respective position or location in the k space from a respective closest edge of the k space corresponds for example to a maximum of 25% of a diameter or a size of the k space in at least one dimension. In other words, therefore only the corresponding edge region of the k space is then modified.

The value of 25% is stated as an example and is only used to clarify the procedure, and does not limit the disclosure to this or similarly sized values. Depending on respective requirements in individual cases, therefore, any suitable corresponding values between 0% and 100%, for example, can be selected.

The procedure described herein is advantageous since in the k space the size of the respective k space values usually decreases from the center of the k space toward the edge of the k space in undisturbed measurement datasets. Local peaks lying in an edge region of the k space are therefore highly likely to be attributable to disturbances or interfering influences during measurement or recording of the measurement dataset. That is to say the proposed procedure therefore makes it possible to prevent undisturbed values with greater reliability, that is to say those k space values describing or representing real features or properties of the respective mapped target object are removed from the measurement dataset. This can also contribute to an improvement in image quality, and an improvement in the accuracy and meaningfulness of the magnetic resonance image generated from the modified measurement dataset.

In a further advantageous embodiment of the present disclosure, the k space values are additionally analyzed in terms of their location in the k space covered by the measurement dataset. Then, those of the k space values that remain in the measurement dataset do satisfy at least the predetermined threshold value criterion, but lie at most at a predetermined distance from orthogonal coordinate axes of the k space running through a center of the k space. In this regard, the center of the k space lies at an intersection of the coordinate axes, that is to say approximately at a zero point of a corresponding coordinate system of the k space. In other words, a predetermined local criterion and location criterion is taken into account here, that is to say evaluated or established, in addition to the predetermined threshold value criterion. This means that a k space value that does satisfy the predetermined threshold value criterion, that is to say represents a local maximum for example, but additionally also satisfies the location criterion, that is to say lies in a predetermined region or a predetermined vicinity of the coordinate axes, is then not removed from the measurement dataset. Advantageously, this approach makes it possible to prevent, in a particularly reliable manner, false or errored detections, that is to say the removal of k space values that are not disturbed or not affected by interfering influences. Advantageously, this can also ultimately contribute to an improved image quality and meaningfulness of the magnetic resonance image.

In the same way, provision can be made particularly advantageously for a check to be made on whether, at a predetermined distance from or in the vicinity of those k space values or peaks whose size satisfies at least a predetermined threshold value criterion, further peaks, that is to say local maxima, are present. Only those k space values are then automatically removed from the measurement dataset in whose predetermined vicinity along an x axis and/or along a y axis of the k space, no further peaks, that is to say local maxima, are present. A respective k space value is only removed, therefore, if the distance between the said k space value and a closest peak to same, in each case, in the k space, in particular along the x axis and/or along the y axis, that is to say in the x and/or y direction of the k space, corresponds to at least the predetermined distance, that is to say is greater than or at least as great as a predetermined distance threshold value. Advantageously, this approach makes it possible to prevent, particularly reliably, the removal of genuine k space values from the measurement dataset, that is to say those k space values that represent real properties of the respective target or investigation object.

For example, in the case of high head slices, a k space in the right-left direction, that is to say approximately in the x direction from the center of the k space toward its edge, can look at least in essence sinc-like, that is to say be described or mapped by a sinc function at least by way of approximation. This means that an intensity, that is to say a size or value, of the k space values in this direction can be described by an oscillation decreasing monotonically, but not rigidly so, from the center of the k space outward with multiple passes through zero. This can be caused, for example, by the relatively narrow fluid region between the two hemispheres, which has a high signal intensity. If an extension of this region in the right-left direction in the k space or, respectively, in the measurement dataset, only measures a few voxels for example, its signal therefore corresponds to a "Point Spread Function." In this regard, reference is made at this point to FIG. 5, in which this can be seen or is at least suggested.

In a further advantageous embodiment of the present disclosure, to generate the modified measurement dataset, only those k space values are removed from the measurement dataset whose size as weighted with their respective location in the k space covered by the measurement dataset with reference to its center or central region satisfies at least the predetermined threshold value criterion. In this regard, k space values lying farther away from the center or central region of the k space are given a greater weighting. In other words, a predetermined weighting function is therefore applied initially to the k space values, that is to say to the measurement dataset, and only subsequently the threshold value criterion applied or evaluated to determine the k space values to be removed. The predetermined weighting function results in this regard in the sizes of those k space values that lie farther away from the center of the k spaces being increased, in particular increased more strongly than the sizes of those k space values that lie comparatively closer to the center of the k space.

With regard to the weighting function, examples include $g=(ax^2+bx^2)$ or $g=\sqrt{(ax^2+bx^2)}$, or any suitable multiplicity of further different functions can be used, for example. In this regard, a and b are predefined or predefinable parameters, while x and y represent the coordinates, that is to say the location of the respective k space value in the k space. Then, g is a resulting weighting factor, by which for example the size of the respective k space values is multiplied, or which can be added to the size of the respective k space. This weighting of the k space values is used in this respect to determine the k space values to be removed. The weighting function or the weighting factor g influences the measurement dataset via the removal of the k space values from the measurement dataset, and therefore not the generation of the magnetic resonance image. The weighting of the k space values, that is to say the application of the weighting function, can therefore be applied temporarily or in a temporary memory or on a copy of the measurement dataset for example, to ensure that the magnetic resonance image is generated from actually measured and not from weighted k space values.

Position-dependent or location-dependent weighting of the k space values makes it possible, advantageously, to take into account of the fact that regions lying farther away from the center of the k space are usually less energetic, that is to say smaller k space values or k space values with smaller sizes occur in these regions than in regions of the k space closer to the center. The procedure described herein therefore also makes it possible to increase the likelihood that only those k space values are removed from the measurement dataset that have actually been generated or affected by disturbances or interfering influences, and do not describe or represent any actual real properties or features of the target object.

In a further advantageous embodiment of the present disclosure, prior to removal of k space values from the measurement dataset, a threshold value is automatically calculated with regard to the predetermined threshold value criterion. This threshold value may be calculated on an individual basis (e.g., based on one of the k space values in the measurement dataset), or may be calculated based on a median value or average value of the k space values of the measurement dataset, or at least a predetermined sub region or part of the measurement dataset. In this regard, a k space value (or its size, respectively) satisfies the predetermined threshold value criterion if the respective k space value (or its size, respectively) is equal to the calculated threshold value or greater than the calculated threshold value. Furthermore, a quantity of the k space values which satisfy the predetermined threshold value criterion is then determined automatically. This quantity is then compared to a predetermined quantity threshold value. If the determined quantity is greater than the quantity threshold value, the determined threshold value is automatically increased.

Then, in an iterative process after increasing the threshold value, the quantity of k space values that then satisfy the threshold value criterion with the correspondingly increased threshold value, that is to say whose size is greater than or equal to the increased threshold value, is determined anew. This new quantity of k space values is then compared again to the predetermined quantity threshold value, and when relevant the threshold value increased again. In this way, in an iterative process, the threshold value is increased stepwise, and the quantity of k space values which, in each case, satisfy the threshold value criterion with the respectively current threshold value is determined and compared to the quantity threshold value until, at most, as many k space values satisfy the threshold value criterion with the respectively current threshold value as predefined by the quantity threshold value. In other words, it is therefore possible to predefine, through the quantity threshold value, how many k space values at most are removed from the measurement dataset. In this regard, the quantity threshold value can be an absolute or relative number.

The quantity threshold value can be dependent, for instance, upon the size of the measurement dataset, that is to say a quantity of k space values contained in the measurement dataset. The more k space values that were acquired, that is to say are contained in the measurement dataset, the more k space values can then be removed from the measurement dataset, for example. As an example, that is to say if the measurement dataset forms a 256×256 matrix, 8 can be predefined as the quantity threshold value so that of the 65,536 k space values in the measurement dataset, a maximum of 8 k space values is allowed to be automatically removed. Advantageously, this makes it possible to reliably prevent too many k space values being removed, for example due to an unfavorably selected threshold value criterion given respective individual recording conditions in an individual case. Advantageously, it is therefore possible to prevent the meaningfulness or the content of the resulting magnetic resonance image from being reduced or restricted too greatly.

A weighting of the k space values can also be initially performed during the procedure described herein. The median or average value, that is to say the threshold value, can then be determined correspondingly based on weighted k space values. As an example, the threshold value for the predetermined threshold value criterion can be determined as two-times the median value, that is to say the median, of all k space values greater than 0.

In the same way, provision can be made for example, in the case of a predetermined quantity threshold value M, to remove precisely (or at most) the M or M % greatest of the determined k space values or peaks.

In an advantageous development of the present disclosure, the quantity threshold value is determined depending on the size of the k space covered by the measurement dataset and/or depending on the quantity of k space values contained in the measurement dataset. This can be effected automatically, for instance. To do so, as an example a corresponding function, specification, or dependency can then be predefined for the quantity threshold value in place of an absolute number. This approach makes it advantageously possible for the method embodiments as described herein to be applied automatically, and particularly flexibly, to different applications or individual cases with measurement datasets of different sizes in a consistent manner.

In a further advantageous embodiment of the present disclosure, during analysis the k space covered by the measurement dataset is searched for local peaks, that is to say local maxima or extreme values. With regard to each peak found at respective coordinates x, y in the k space, a check is then done on whether there is likewise a local peak at respective coordinates −x, −y. If so, the respective k space values at the respective coordinates x, y and −x, −y are removed from the measurement dataset regardless of the predetermined threshold value criterion. In other words, a symmetry criterion is taken into account and evaluated. If, with regard to a peak found at the coordinates x, y, there is a corresponding peak at the coordinates −x, −y, then there is a particularly high level of confidence that this involves mirrored peaks generated by a reconstruction algorithm, for example the POCS algorithm. This symmetry criterion therefore makes it possible to find and remove peaks of this kind particularly reliably. This can also ultimately contribute advantageously to an improved image quality and meaningfulness of the magnetic resonance image.

In a further advantageous embodiment of the present disclosure, during the analysis a histogram is generated of the k space values, that is to say of the measurement dataset. With regard to the predetermined threshold value criterion a class or bin of the histogram is then determined in which the predetermined threshold value criterion is satisfied for all k space values having a respective size that falls into the determined class or a higher class of the histogram. In other words, the class determined is used as the threshold value for the threshold value criterion. In particular, the size of the k space values can be plotted in the histogram against a quantity or count of k space values with the corresponding size, that is to say the corresponding value, contained in the measurement dataset.

To generate the histogram, for example a minimum and a maximum k space value, that is to say a minimum and a maximum size of the k space values contained in the measurement dataset, can be determined. An interval given or defined by these maximum and minimum values can then be subdivided, for example, into a predetermined quantity of classes. Which class of the histogram is determined for the threshold value criterion in this regard can be predefined in absolute or relative terms in advance, or for example determined, that is to say defined, following generation of the histogram by, for instance an automatic, automated, or semi-automatic evaluation or analysis of the histogram or a shape of the histogram. The histogram can be understood as a spectrum or spectral distribution of the measurement dataset. Advantageously, the procedure described herein can frequently allow or enable the measurement dataset to be adapted particularly well to the respective individual case and/or to be modified in a particularly simple and plainly understandable manner. Thus, for example it can also be possible, in a particularly simple and plain manner, for less well trained personnel to determine a suitable class for the threshold value criterion on the basis of the histogram. As a result, advantageously, the embodiments of the methods described herein are therefore capable of being applied particularly simply and reliably even in the case of incomplete automation.

In a further advantageous embodiment of the present disclosure, during the analysis a histogram or a spectrum of the k space values is generated. A model function is then automatically adapted to a shape or a profile of the histogram or spectrum so that the adapted model function has at least one zero point. With regard to the threshold value criterion the zero point, e.g. a smallest zero point lying at a value greater than 0, of the adapted model function is then defined as the threshold value. The k space values which then lie above the threshold value determined or defined in this manner along the x axis in the histogram or spectrum, then satisfy the predetermined threshold value criterion. In other words, the threshold value can therefore be determined dynamically depending on a shape or profile of the histogram or spectrum of k space values, that is to say the measurement dataset. As a result, advantageously, the threshold value can be adapted dynamically and individually to the respective measurement dataset. Adaptation of the model function can be carried out, for example, by means of curve adaptation, fitting, equalization calculation, or any other suitable similar techniques.

In a further advantageous embodiment of the present disclosure, during the analysis a profile of complex phases of the k space values is additionally analyzed (e.g., over and above) the measurement dataset. Then, those k space values whose phases diverge by more than a predetermined phase threshold value from a phase of at least one respective adjacent k space value are likewise removed from the measurement dataset. In other words, therefore those k space values which or whose phases respectively exhibit a phase "jump" of at least a predetermined size with respect to respective surrounding k space values or their phases respectively, can be removed from the measurement dataset. This procedure is based on the finding that a phase profile of the k space values across the measurement dataset, without interfering influences during recording of the measurement dataset, is usually smooth, that is to say does not have "jumps" of a certain size, for example by $\pi$. Consequently, phase jumps of this kind can be used as an additional sign of interfering influences. Removing corresponding k space values therefore likewise makes it possible to improve the image quality and meaningfulness of the magnetic resonance image. In this regard, the k space values can be understood or represented as complex numbers with a real component and an imaginary component. For example, a k space value K can be represented as $K=M \cdot e^{-i\varphi}$, with a magnitude M and the phase $\varphi$, or as $K=Re+i \cdot Im$, with the real part Re and the imaginary part Im, with the phase then being given by the arg function thus applied.

A further aspect of the present disclosure is a computer program or computer program product (e.g., a non-transitory computer readable medium) that includes executable code or otherwise is configured to execute, when read by one of more hardware processors configured to do so, the method steps of at least one embodiment of the methods as described herein. The computer program or computer program product may be, for example, loaded onto a data memory of a corresponding data processing facility, such as a data processing facility of a magnetic resonance system, and may thus be configured to realize and execute the various method steps. The computer program or computer program product can therefore comprise a program means for carrying out each of the methods as described herein when the computer program or computer program product is executed by or by means of the data processing facility, such as by hardware processor circuitry of the data processing facility.

A further aspect of the present disclosure is a data memory, in particular an electrically or electronically readable data memory (which may also constitute a non-transitory computer readable medium), for a data processing facility, such as for a magnetic resonance system, for instance. In this regard, a program code which comprises at least one embodiment of the computer program or computer program product may be stored in or on the data memory. Further control instructions for the data processing facility and/or the magnetic resonance system can additionally be stored or coded in the data memory, such as part of the stored program code for example. The program code stored on or in the data memory is therefore configured and set up in particular to implement at least one embodiment of the methods described herein, or to cause the implementation of one or more of the method embodiments as described herein during use of the data memory in the data processing facility or the magnetic resonance system, and during execution of the program code by the data processing facility or the magnetic resonance system. The data memory can be any suitable type of memory, such as non-volatile data memory, for instance.

A further embodiment of the present disclosure is a magnetic resonance system with an acquisition facility for acquiring a measurement dataset comprising a multiplicity of k space values. Furthermore, the magnetic resonance system has a data processing facility, having a data memory and a processor facility connected to same by means of a data link, which may thus be configured to execute the program code stored in the data memory. In other words, the embodiments of the magnetic resonance system described herein are therefore realized and set up in particular to execute or carry out at least one embodiment of the methods as described herein. The magnetic resonance system can therefore be, in particular, the magnetic resonance system stated in conjunction with the method embodiments further described herein. Accordingly, the magnetic resonance system can have a few or all of the properties and/or components or elements stated in conjunction with the method embodiments further described herein or the other embodiments of the present disclosure, and vice versa.

A further embodiment of the present disclosure is a system consisting of a magnetic resonance system with an acquisition facility for acquiring a measurement dataset comprising a multiplicity of k space values, and a data processing facility having a data memory and a processor facility connected to same, for executing the program code stored in the data memory. In the system embodiment therefore, the data processing facility does not necessarily need to form part of the magnetic resonance system itself.

The properties and developments of the embodiments of the methods, the computer program, the data memory, and the magnetic resonance system disclosed in the foregoing and below, and also the corresponding advantages, are mutually transferrable between embodiments of the present disclosure according to the sense in each case. Also forming part of the disclosure therefore are such developments of the method, the computer program, the data memory, and the magnetic resonance system that have embodiments which, to avoid unnecessary redundancy, are not separately described here explicitly in the respective combination or for every aspect of the disclosure.

The exemplary embodiments explained below constitute preferred embodiments of the disclosure. In the exemplary embodiments, the described components of the embodiments each represent individual features, to be considered independently of each other, of the disclosure, and which develop the disclosure, in each case also independently of each other, and therefore must also be seen individually or in some other combination than that shown, as a constituent element of the disclosure. Furthermore the described embodiments are also capable of being augmented by further or already described features of the disclosure.

FIG. 1 shows a schematic view of an example magnetic resonance system, in accordance with an embodiment of the present disclosure. FIG. 1 shows a schematic view of a magnetic resonance system 1. The magnetic resonance system 1 is realized here in the form of a magnetic resonance tomography unit with a space for positioning the patient in which, in the present case, a patient 2 is arranged for an investigation or scan. Thus, the magnetic resonance system 1 may include or be implemented as part of what is referred to as a magnetic resonance data acquisition scanner, a data acquisition scanner, or simply a scanner. In the present example, the magnetic resonance facility 1 has a data processing facility 3 (e.g., a processing unit, processing system, control computer, etc.), which for its part comprises a processor facility 4 and a data memory 5. The magnetic resonance system 1, in particular the data processing facility 3, is connected in the present example to a display facility 6. For example, the display facility 6 can be a monitor for displaying magnetic resonance images of the patient 2 which are generated by way of the magnetic resonance system 1 or the data processing facility 3, respectively. In various embodiments, the data processing facility 3 and/or the processor facility 4 may include any suitable number and type of hardware processors to facilitate the functions of the embodiments as described herein. For instance, in conjunction with the data processing facility 3, the magnetic resonance data acquisition scanner may function to perform a patient MR scan to acquire a measurement dataset comprising a multiplicity of k space values, as discussed herein. Moreover, the data memory 5 may be implemented as the aforementioned non-transitory computer-readable medium having instructions stored thereon such that, when executed by the data processing facility 3 and/or the processor facility 4, may facilitate the functions of the embodiments as described herein.

In magnetic resonance imaging, diffusion imaging is often carried out in combination with Partial Fourier techniques (PF techniques). The characterizing feature of Partial Fourier techniques is that only part (e.g. half) of a k space is fully sampled, that is to say measured or acquired, while the remaining part (e.g. the other half) of the k space is not or only partly sampled, that is to say acquired. A Partial Fourier technique applied in the phase-coding direction can be used in this regard to shorten an echo time, for example for single-shot Echo Planar Imaging (single-shot EPI). A Partial Fourier technique can be used in the readout direction, on the other hand, to shorten a total acquisition time for acquiring a respective measurement dataset during application of a so-called "readout segmented EPI sequence," also referred to as a RESOLVE sequence in abbreviated form.

A measurement dataset acquired by way of a Partial Fourier technique can have different reconstruction techniques or reconstruction methods applied to it for completing or filling-in the k space. In a particularly simple example, the non-acquired part of the k space can be left as it is if a corresponding matrix, for example with zeroes or zero values, has been initialized for the measurement dataset. A regular imaging method or Fourier transformation in accordance with known techniques, can then be applied to that measurement dataset for reconstruction. This method is also known as "zero filling," since the k space is effectively "filled in" with zeroes or zero values. This method is admittedly particularly easy to apply, but can disadvantageously introduce or generate additional fuzziness compared to a complete, that is to say not partial, acquisition of the k space.

As an improved alternative that preserves spatial resolution, a so-called POCS algorithm can be applied. For example, when RESOLVE is applied, mesh-like or network-like patterns or artifacts occasionally appear in the generated magnetic resonance image, which not only worsen image quality but, for example, can mask lesions and therefore make a diagnosis or evaluation more difficult.

It has been found that these patterns or artifacts can be caused by local peaks or maxima in k space, which act like additional k space centers and can be introduced or duplicated in an edge region or periphery of k space by a reconstruction with the POCS algorithm.

There is therefore need for a method or procedure for preventing, attenuating, or reducing these patterns or artifacts, and which at the same time retains, in this regard, the improved spatial resolution that can be achieved by means of the POCS algorithm compared to the simple zero-filling method, which is further discussed below with reference to FIG. 2.

Figure 2:
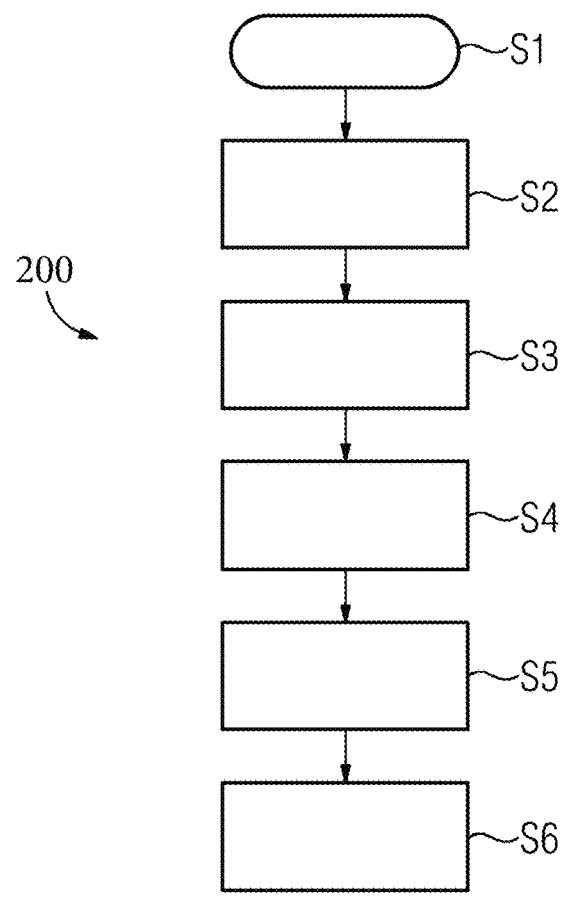
FIG. 2 shows an exemplary method flow for generating a magnetic resonance image, in accordance with an embodiment of the present disclosure.

FIG. 2 shows an exemplary method flow for generating a magnetic resonance image, in accordance with an embodiment of the present disclosure. The various steps described below with reference to method flow 200 may be executed by one or more processors of a magnetic resonance system, such as the magnetic resonance facility 1 as shown and discussed above with reference to FIG. 1 for instance. For example, the method flow 200 may be executed via the data processing facility 3 and/or via the processor facility 4 executing instructions stored in the data memory 5.

FIG. 2 shows an exemplary method flow 700 that may begin, for example, when the patient 2 is positioned (block S1) in the magnetic resonance system 1, the magnetic resonance system 1 is activated (block S1), and/or parameters, threshold values, settings, and/or other similar items needed for the further method are specified (block S1).

The method 200 may further include one or more processors (e.g., the data processing facility 3 and/or the processor facility 4) acquiring (block S2) a measurement dataset from k space values, that is to say in the present example with reference to FIG. 1 the patient 2 is scanned by means of the magnetic resonance system 1.

The method 200 may further include one or more processors processing (block S3) the acquired measurement dataset by means of the data processing facility 3, for example. In this regard, for example non-sampled or non-measured parts or regions of the k space can be reconstructed or filled in, and the k space values automatically analyzed at least in terms of their size. Likewise, the k space values can be analyzed in terms of their phase or relative phase relationships, their position in k space, and/or further characteristics, features, or properties. In the present example, the k space or the measurement dataset respectively is searched for local peaks or maxima.

Figure 3:
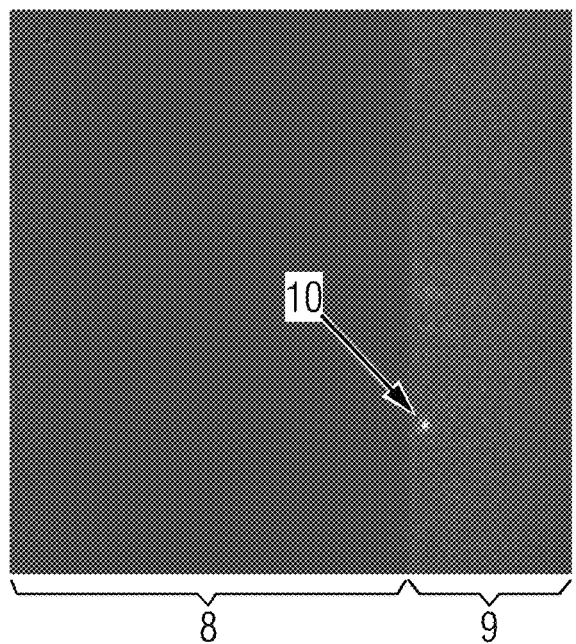
FIG. 3 shows an example differential image of k space values with a part reconstructed by means of a POCS algorithm and a peak, in accordance with an embodiment of the present disclosure.

Turning now to FIG. 3, in this regard, FIG. 3 shows a differential image of k space values with a sample region 8 and a region 9 reconstructed by means of a POCS algorithm. In this example, a local peak 10 can be clearly seen as a bright spot in the region 9 reconstructed by means of the POCS algorithm. This peak 10 would result in the said interfering patterns or artifacts in a subsequent image generation process.

Figure 5:
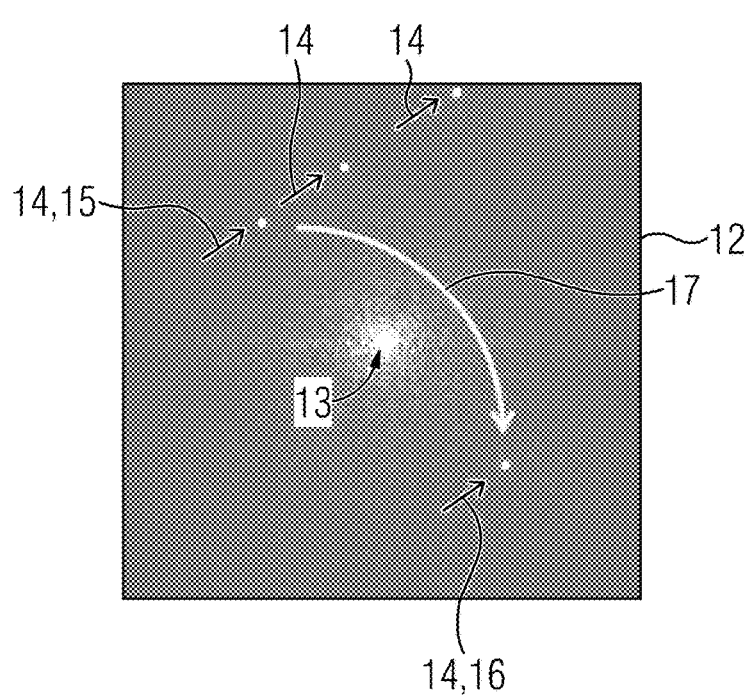
FIG. 5 shows an illustration of an example measurement dataset in k space with a local peak generated by a POCS algorithm, in accordance with an embodiment of the present disclosure.

Turning now to FIG. 5, which shows an image of a complete k space 12 with a center 13 with high energy or intensity. Multiple peaks 14 can be seen here, which lie clearly outside the center 13. For example, one of these peaks 14 is located at an original position 15 with the coordinates x, y in the k space 12. During reconstruction of parts of the k space 12 not acquired by means of the magnetic resonance system 1 by the POCS algorithm, a further peak is introduced or generated with the coordinates −x, −y at a mirror position 16, which represents a mirroring or duplication of the peak 14 at the original position 15. This is indicated schematically here by an arrow 17.

Embodiments include the method 200 generating (block S3) a spectrum or histogram of the measurement dataset or the k space values, respectively. Turning now to FIG. 6, a histogram 18 of this kind is shown as an example. In this regard, the absolute k space values for an exemplary measurement dataset are entered on the x axis 19 of the histogram 18. Moreover, in this regard a value range covered by the k space values, that is to say an interval between a smallest and a largest of the k space values, is divided into 100 classes for the present histogram 18, for example. The absolute values occurring in the k space, that is to say in the measurement dataset, are then sorted into these 100 classes or bins. A quantity of k space values with corresponding sizes or absolute values is correspondingly entered on the y axis 20 of the histogram 18.

In the present example in fact at least one value, which cannot be seen in detail in FIG. 6 due to scaling, is located at least in class 100 of the histogram and, when relevant, is also included in at least a few of classes 14 to 99 in this regard. A maximum value for the histogram can be determined, for example, across the overall k space 12 including the center 13. However, a histogram analysis of the histogram 18 can then, for example, only relate to an edge region of the k space 12 outside the center 13, for example the outermost 25% on each side of the k space 12. That is to say this takes account of one location of the k space values in the k space 12. In the same way, a model function can be adapted to a shape or a profile of the histogram 18, and for example its zero point taken into account or used in the following. Likewise, the method flow 200 may include for example, during processing or analysis of the measurement dataset or the k space values respectively, applying (block S3) a weighting function to the measurement dataset or the k space values, respectively.

The method flow 200 may include defining (block S4) a threshold value for a threshold value criterion in line with a corresponding specification. As an example, absolute values of the k space values for the k space 12 are initially determined and weighted with their respective location or geometric position in the k space 12, where the center 13 of the k space should lie at position 0, that is to say at coordinates x=0, y=0. As a result, advantageously, disturbances or deviations normally disposed, that is to say without interfering influences, in low-energy edge regions of the k space 12, in this example the peaks 10, 14, receive a greater weighting than k space values lying nearer the center 13. Following this weighting, a median of the weighted k space values with values greater than 0 is determined, and the threshold value determined as two-times this median. In the same way, on the basis of the histogram 18, a class of the histogram 18 designated here as a limit class 21 can be determined as the threshold value.

Then, all of the weighted k space values that exceed this threshold value may be determined. In this regard, respective coordinates or positions of these k space values are determined and taken into account, and only such of these k space values that lie in a certain sub region of the k space 12 are selected. As an example, in the case of Partial Fourier data, those regions from all sides of the k space 12 that were reconstructed by means of a respective Partial Fourier reconstruction method on the respective side are used for this purpose. Continuing this example, with a Partial Fourier factor of three-quarters, this can therefore relate to or comprise 25% on each side of the k space 12.

Then, a check is made depending on an overall size of the k space 12, that is to say a total quantity of k space values contained in same, as to how many k space values exceeding the threshold value, that is to say satisfying the threshold value criterion and lying in the corresponding sub region of the k space 12, were determined. This quantity is compared to a predetermined quantity threshold value. If the quantity threshold value is reached or exceeded, the threshold value for the threshold value criterion is raised (e.g. increased by 10%, 20%, 50%, etc.) and a new check is made regarding how many of the k space values in the corresponding sub region of the k space reach or exceed this increased threshold value. If a lesser or the same number of k space values were determined as specified by the quantity threshold value, then the method flow 200 continues (block S5) as further discussed below. Otherwise, the threshold value for the threshold value criterion is raised anew in an iterative process, and the check on the quantity is carried out afresh on the basis of the quantity threshold value.

The method flow 200 may include removing (block S5) the determined k space values, that is to say in the present example replaced by zero, with the result being that a modified measurement dataset is generated from the original measurement dataset. When the original measurement dataset was acquired by means of a Partial Fourier technique and the k space 12 was then partly reconstructed, a symmetry criterion may be additionally checked (block S5). In this regard, a check is made on whether in regard to a peak found at respective coordinates x, y in the k space 12, a corresponding peak exists at the respective coordinates −x, −y. If so the two peaks at the coordinates x, y and −x, −y are likewise removed.

Furthermore, the method flow 200 may include additionally checking (block S5) a location criterion. In this regard, a check is made regarding whether the positions of the determined k space values lie in a predetermined vicinity of coordinate axes of the k space 12 running through the center 13. Positions or k space values, respectively, where this is not the case are then discarded, that is to say retained and not removed from the measurement dataset.

When these additional conditions or criteria are satisfied, all k space values that lie above the limit class 21 in the histogram 18 are therefore removed from the measurement dataset, for example.

Figure 4:
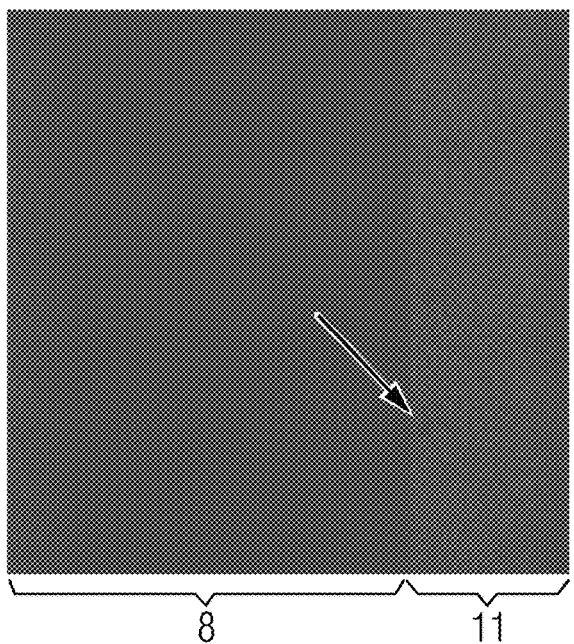
FIG. 4 shows the example differential image in FIG. 3 after application of sub steps of the method in FIG. 2, in accordance with an embodiment of the present disclosure.

Turning now to FIG. 4 shows, corresponding to FIG. 3, an example differential image of k space values following block S5 of the method 200 is shown. It can be clearly seen here that, as compared to the image shown in FIG. 3, that the peak 10 at the same position, which is likewise indicated by an arrow, is no longer present in the modified region 11, which corresponds to the reconstructed region 9 in FIG. 3.

The method flow 200 may include generating (block S6) a magnetic resonance image 22 (see FIG. 9) with improved image quality from the modified measurement dataset, from which therefore the determined k space values that arose as outliers during the recording or estimation, at least with a certain likelihood of interfering influences, are removed.

In this regard, the steps described with reference to the method 200 can each have interim steps, be subdivided into interim steps, or be combined. In the same way, further method steps, not explicitly described here, can be carried out, for example between the method steps described. As examples, these other steps may include transferring data or retrieving further data, conditions, specifications, or user inputs, or other similar techniques to facilitate the overall execution of the method 200 described herein.

Figure 7:
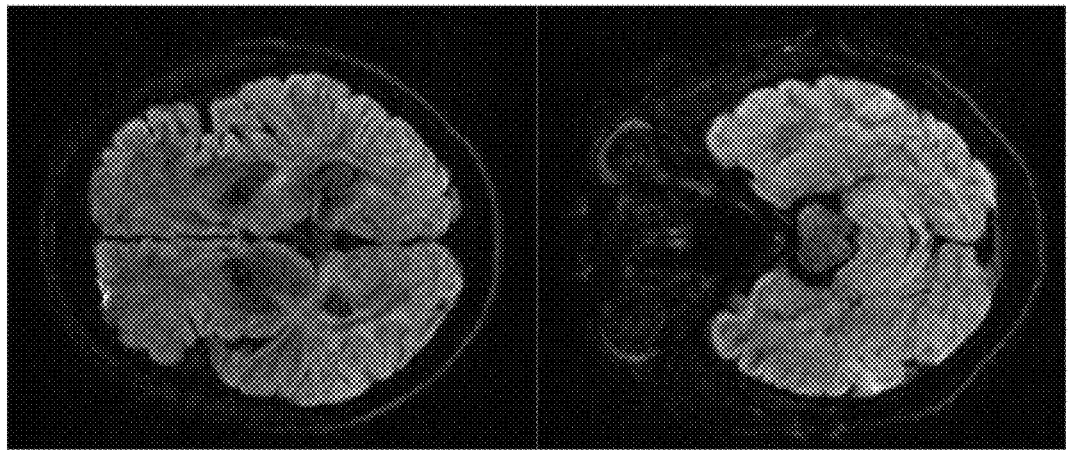
FIG. 7 shows an example of two magnetic resonance images reconstructed by using a conventional zero-filling algorithm.

FIG. 7 shows an example of two magnetic resonance images reconstructed by using a conventional zero-filling algorithm. These images may be compared with those shown in with FIG. 8, which illustrates two magnetic resonance images reconstructed by using a conventional PROCS algorithm. Although the magnetic resonance images presented in FIG. 8 advantageously have an improved local resolution or sharpness compared to the magnetic resonance images presented in FIG. 7, each of the images as shown in FIGS. 7 and 8 disadvantageously have the aforementioned mesh-like or network-like artifacts or patterns.

Figure 9:
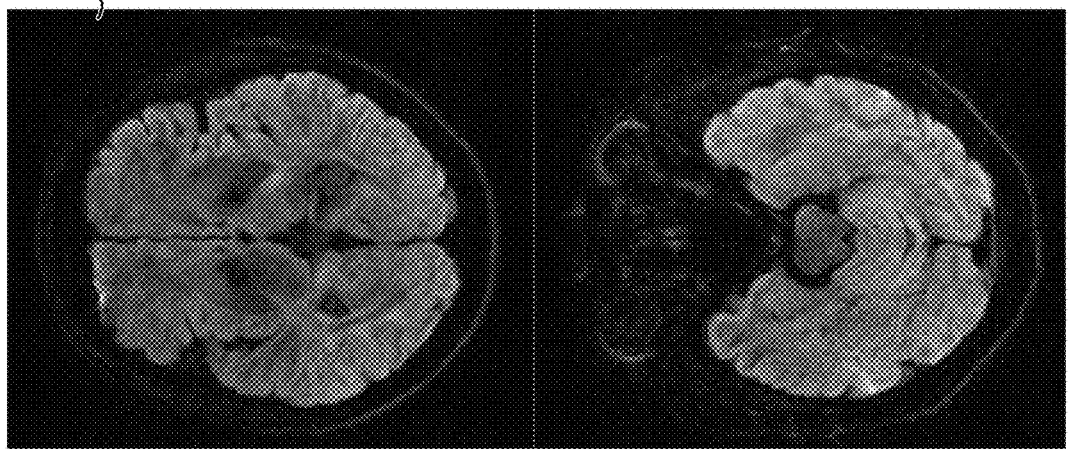
FIG. 9 shows an example of two magnetic resonance images reconstructed by using an improved method, in accordance with an embodiment of the present disclosure.

FIG. 9 shows an example of two magnetic resonance images reconstructed by using an improved method, in accordance with an embodiment of the present disclosure.

Figure 8:
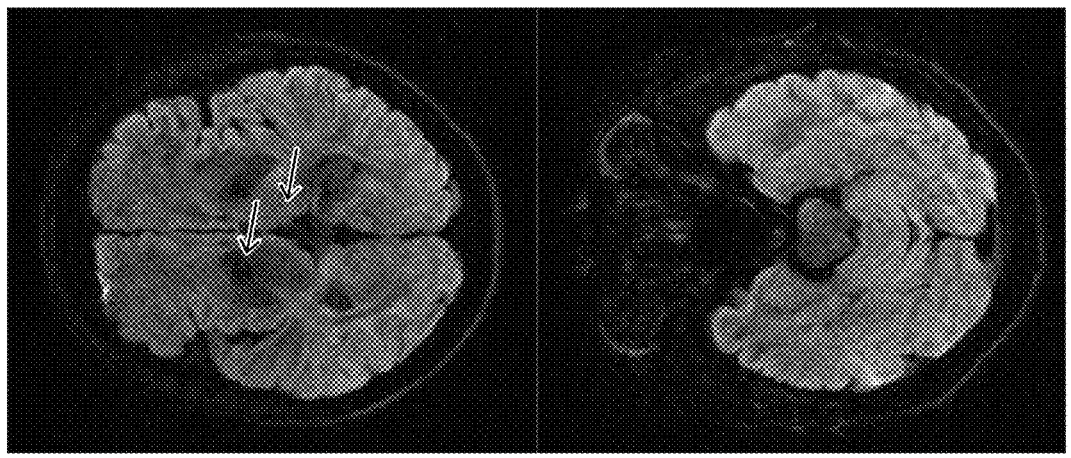
FIG. 8 shows an example of two magnetic resonance images reconstructed by using a conventional POCS algorithm.

The magnetic resonance images presented in FIGS. 7, 8, and 9 are based on the same original measurement dataset, which in this example involves an SMS RESOLVE dataset where b=1000 and a Partial Fourier acquisition with a Partial Fourier factor of 6/8.

With regard to the magnetic resonance image 22 generated according to an embodiment of the method 200, this original measurement dataset was modified by removing peaks, and the magnetic resonance image 22 then generated from the measurement dataset modified in this way. As a result, the magnetic resonance image 22 does have improved sharpness or spatial resolution as, similarly, do the magnetic resonance images presented in FIG. 8, but not the mesh-like or net-like patterns or artifacts contained in the same.

In this regard, the method embodiments described in the present disclosure are not restricted to an improvement in measurement datasets in diffusion imaging, but can be applied in the same way advantageously to other MR sequences, such as for example VIBE (3D Flash), in particular those in which POCS algorithms have likewise generated false, that is to say unwanted phase patterns, up to now.

In the method embodiments described in the present disclosure for generating magnetic resonance images therefore, after acquisition of corresponding measurement datasets, these or respectively corresponding k spaces reconstructed, for example, by means of a POCS algorithm are analyzed retrospectively and values, that is to say data points, of the respective measurement dataset with unusually high values or signal intensities removed. As a result, advantageously, artifacts can be significantly reduced in the resulting magnetic resonance images, a high spatial resolution retained, and for example an improved identifiability or detectability of lesions and other features or properties of the respective target object being mapped can be achieved.

Although the embodiments of the present disclosure have been illustrated and described in detail using the preferred exemplary embodiment, the disclosure is not limited by the disclosed examples, and a person skilled in the art can derive other variations therefrom without departing from the scope of protection of the disclosure.

REFERENCES

The following references are cited throughout this disclosure as applicable to provide additional clarity, particularly with regards to terminology. These citations are made by way of example and ease of explanation and not by way of limitation.

Citations to the following references are made throughout the application using a matching bracketed number, e.g., [1].

[1] Robert Frost et al. Implementation and Assessment of Diffusion-Weighted Partial Fourier Readout-Segmented Echo-Planar Imaging. Magnetic Resonance in Medicine 68:441-451 (2012).

What is claimed is:

1. A method for generating a magnetic resonance image from a measurement dataset acquired via a magnetic resonance data acquisition scanner, the method comprising:
    acquiring, via one or more processors, the measurement dataset from k space values;
    analyzing, via the one or more processors, the k space values with respect to a size of each respective one of the k space values;
    analyzing, via the one or more processors, each respective one of the k space values associated with the measurement dataset with respect to a location in k space;
    generating, via the one or more processors, a modified measurement dataset by (i) removing, from the measurement dataset, each respective one of the k space values having a size that satisfies a predetermined threshold value criterion, and (ii) maintaining each respective one of the k space values in the measurement dataset that has a size that satisfies the predetermined threshold value criterion but is located at most at a predetermined distance from orthogonal coordinate axes of k space running through a center of the k space; and
    generating, via the one or more processors, the magnetic resonance image using the modified measurement dataset.

2. The method of claim 1, further comprising:
    searching, via the one or more processors during the act of analyzing the k space values with respect to the size of each respective one of the k space values, the k space associated with the measurement dataset to identify local peaks that satisfy the predetermined threshold value criterion; and
    removing, via the one or more processors during the act of generating the modified measurement dataset, additional k space values from the measurement dataset that are respectively within a respective predetermined vicinity of the local peaks associated with the k space values that satisfy the predetermined threshold value criterion.

3. The method of claim 1, wherein removing the k space values from the measurement dataset includes replacing the k space values that are removed with zero.

4. The method of claim 1, further comprising:
    removing, from the measurement dataset via one or more processors, only k space values that, in addition to satisfying the predetermined threshold value criterion, are also located in a predetermined sub region of the k space and at an edge of the k space.

5. The method of claim 1,
    wherein the act of generating the modified measurement dataset includes removing only k space values in the measurement dataset having a respective size that, for each respective one of the k space values as weighted with a respective k space value location within the k space with reference to a central region of the k space, satisfies the predetermined threshold value criterion, and
    wherein k space values lying further away from the central region are given a greater weighting than k space values lying closer to the central region.

6. The method of claim 1,
    wherein the act of generating the modified measurement dataset includes, prior to removing k space values from the measurement dataset, calculating the predetermined threshold value criterion based on (i) a value of one of the k space values from the measurement dataset, or (ii) a median value the k space values from the measurement dataset,
    wherein the predetermined threshold value criterion is satisfied when a respective k space value from the measurement dataset has a size that is equal to or greater than the predetermined threshold value, and further comprising:
    iteratively performing, via the one or more processors:
        comparing a quantity of the k space values from the measurement dataset that satisfy the predetermined threshold value criterion to a predetermined quantity threshold value, and when the quantity of the k space values is greater than the predetermined quantity threshold value, increasing the predetermined quantity threshold value in a step-wise manner until the quantity of the k space values corresponds at most to the increased predetermined quantity threshold value.

7. The method of claim 6, further comprising:
determining, via the one or more processors, the predetermined quantity threshold value depending on at least one of (i) the size of the k space associated with the measurement dataset, and (ii) the quantity of k space values contained in the measurement dataset.

8. The method of claim 1, further comprising:
searching, via the one or more processors during the act of analyzing the k space values, the k space associated with the measurement dataset to identify local peaks; and
additionally removing, for each local peak identified at respective coordinates x, y in the k space for which another local peak exists at a mirror position located at respective coordinates −x, −y, the k space values at the respective coordinates x, y and the respective coordinates −x, −y regardless of the predetermined threshold value criterion.

9. The method of claim 1, further comprising:
generating, via the one or more processors during the act of analyzing the k space values with respect to the size of each respective one of the k space values, a histogram of the k space values contained in the measurement dataset;
determining, via the one or more processors, a bin of the histogram,
wherein the threshold value criterion is satisfied for k space values having a respective size that is within or higher than the determined bin of the histogram.

10. The method of claim 1, further comprising:
generating, via the one or more processors during the act of analyzing the k space values with respect to the size of each respective one of the k space values, a histogram or a spectrum of the k space values;
adapting, via one or more processors, a model function to a shape of the histogram or spectrum such that the adapted model function has at least one zero point; and
defining, as the threshold value associated with the predetermined threshold value criterion, a zero point of the adapted model function such that k space values that are located above the threshold value along the x axis in the histogram or spectrum satisfy the predetermined threshold value criterion.

11. The method of claim 1, further comprising:
analyzing, via the one or more processors during the act of analyzing the k space values with respect to the size of each respective one of the k space values, a profile of complex phases of the k space values associated with the measurement dataset, and
removing, from the measurement dataset via one or more processors, k space values having a respective phase that diverges from a phase of at least one respective adjacent k space value by a value that exceeds a predetermined phase threshold value.

12. A non-transitory computer readable media of a magnetic resonance data acquisition scanner for generating a magnetic resonance image from a measurement dataset acquired via a magnetic resonance data acquisition scanner, the non-transitory computer readable media having instructions stored thereon that, when executed by one or more processors of the magnetic resonance data acquisition scanner, cause the magnetic resonance data acquisition scanner to:

acquire the measurement dataset from k space values;

analyze the k space values with respect to a size of each respective one of the k space values;

analyze each respective one of the k space values associated with the measurement dataset with respect to a location in k space;

generate a modified measurement dataset by (i) removing, from the measurement dataset, each respective one of the k space values having a size that satisfies a predetermined threshold value criterion, and (ii) maintaining each respective one of the k space values in the measurement dataset that has a size that satisfies the predetermined threshold value criterion but is located at most at a predetermined distance from orthogonal coordinate axes of k space running through a center of the k space; and generate the magnetic resonance image using the modified measurement dataset.

13. The non-transitory computer readable media of claim 12, further including instructions that, when executed by one or more processors of the magnetic resonance data acquisition scanner, cause the magnetic resonance data acquisition scanner to:

search, during the analyzing of the k space values with respect to the size of each respective one of the k space values, the k space associated with the measurement dataset to identify local peaks that satisfy the predetermined threshold value criterion; and remove, during the generating of the modified measurement dataset, additional k space values from the measurement dataset that are respectively within a respective predetermined vicinity of the local peaks associated with the k space values that satisfy the predetermined threshold value criterion.

14. The non-transitory computer readable media of claim 12, further including instructions that, when executed by one or more processors of the magnetic resonance data acquisition scanner, cause the magnetic resonance data acquisition scanner to:

remove, from the measurement dataset, only k space values that, in addition to satisfying the predetermined threshold value criterion, are also located in a predetermined sub region of the k space and at an edge of the k space.

15. The non-transitory computer readable media of claim 12, further including instructions that, when executed by one or more processors of the magnetic resonance data acquisition scanner, cause the magnetic resonance data acquisition scanner to:

search, during the analyzing of the k space values with respect to the size of each respective one of the k space values, the k space associated with the measurement dataset to identify local peaks; and additionally remove, for each local peak identified at respective coordinates x, y in the k space for which another local peak exists at a mirror position located at respective coordinates −x, −y, the k space values at the respective coordinates x, y and the respective coordinates −x, −y regardless of the predetermined threshold value criterion.

16. A magnetic resonance system for generating a magnetic resonance image from a measurement dataset acquired via a magnetic resonance data acquisition scanner, the system comprising:

a magnetic resonance data acquisition scanner configured to acquire the measurement dataset from k space values; and a processing system configured to:

analyze the k space values with respect to a size of each respective one of the k space values;

analyze each respective one of the k space values associated with the measurement dataset with respect to a location in k space;

generate a modified measurement dataset by (i) removing, from the measurement dataset, each respective one of the k space values having a size that satisfies a predetermined threshold value criterion, and (ii) maintaining each respective one of the k space values in the measurement dataset that has a size that satisfies the predetermined threshold value criterion but is located at most at a predetermined distance from orthogonal coordinate axes of k space running through a center of the k space; and generate the magnetic resonance image using the modified measurement dataset.

17. The magnetic resonance system of claim 16, wherein the processing system is further configured to:

search, during the analyzing of the k space values with respect to the size of each respective one of the k space values, the k space associated with the measurement dataset to identify local peaks that satisfy the predetermined threshold value criterion; and remove, during the generating of the modified measurement dataset, additional k space values from the measurement dataset that are respectively within a respective predetermined vicinity of the local peaks associated with the k space values that satisfy the predetermined threshold value criterion.

18. The magnetic resonance system of claim 16, wherein the processing system is further configured to:

remove, from the measurement dataset, only k space values that, in addition to satisfying the predetermined threshold value criterion, are also located in a predetermined sub region of the k space and at an edge of the k space.

19. The magnetic resonance system of claim 16, wherein the processing system is further configured to:

search, during the analyzing of the k space values with respect to the size of each respective one of the k space values, the k space associated with the measurement dataset to identify local peaks; and additionally remove, for each local peak identified at respective coordinates x, y in the k space for which another local peak exists at a mirror position located at respective coordinates −x, −y, the k space values at the respective coordinates x, y and the respective coordinates −x, −y regardless of the predetermined threshold value criterion.

20. The method of claim 1, wherein the act of analyzing the k space values with respect to the size of each respective one of the k space values comprises analyzing the k space values that have been reconstructed via a Projection Onto Convex Sets (POCS) algorithm.

* * * * *